United States Patent [19]

Yokoo et al.

[11] Patent Number: 4,634,270
[45] Date of Patent: Jan. 6, 1987

[54] PROTECTIVE COVER

[75] Inventors: Sadao Yokoo, Kanagawa; Tadashi Shimomura, Tokyo; Soichi Torisawa, Tokyo; Masahiro Dan, Tokyo; Tsuyoshi Kaneda, Tokyo, all of Japan

[73] Assignees: Nippon Sheet Glass Co., Ltd., Tokyo; Hitachi Ltd., Osaka; Hitachi Microcomputer Engineering Ltd., Tokyo, all of Japan

[21] Appl. No.: 789,071

[22] Filed: Oct. 18, 1985

[30] Foreign Application Priority Data

Oct. 19, 1984 [JP] Japan ................... 59-219669

[51] Int. Cl.$^4$ .................. G03B 27/28; G03B 27/52
[52] U.S. Cl. .................. 355/125; 355/30; 355/53; 355/75
[58] Field of Search .............. 355/75, 125, 30, 53, 355/18, 54, 133

[56] References Cited

U.S. PATENT DOCUMENTS 4,063,812 12/1977 Abraham et al. ............. 355/18
4,131,363 12/1978 Shea et al. ............. 355/75
4,402,600 9/1963 Araihara ............. 355/125

Primary Examiner—Richard A. Wintercorn
Attorney, Agent, or Firm—Woodcock Washburn Kurtz Mackiewicz & Norris

[57] ABSTRACT

A protective cover for photoprinting system comprises a cover portion made of a transparent thin plate of inorganic material, an antireflection multiple coating provided on at least one of the inner and outer surfaces of the cover plate, and a spacer arranged on the peripheral portion of the cover plate for keeping the inner surface of the cover plate away from the surface to be protected, e.g., pattern surface of photomask and sealing the space between them.

Since the cover plate is made of inorganic material, the mechanical strength thereof is large. Since the cover plate is thin and the antireflection multiple coating is provided on the cover plate, absorption of light therein is little and confusion of the pattern image due to rays reflected by the boundaries of the cover plate is ignorable.

7 Claims, 8 Drawing Figures

PROTECTIVE COVER

BACKGROUND OF THE INVENTION

1. Field of the Invention

This invention relates to a protective cover for photoprinting system to avoid contamination or physical damage on the surface of, e.g., photomask used in manufacturing process of LSI.

2. Description of the Prior Art

In photoprinting process for manufacturing LSI, there is used a photomask in which, for example, Cr-layer is deposited onto a glass substrate in a desired negative pattern. Photoresist coated on a silicon wafer is exposed through the photomask. Consequently, a part of the photoresist is hardend in a similar pattern to the apertures of the photomask. In such a patterning process, if there are defects such as dusts or scratches on the pattern surface of the deposited layer or the back surface of the glass substrate of the photomask or the surface of the photoresist on the silicon wafer, accurate patterning cannot be effected, resulting low yield of LSI.

In the U.S. Pat. No. 4,063,812, a photomask is sandwiched by glass plates to protect the pattern surface from dusts or scratches. By such protection, dusts or the like can but be deposited on the exterior surface of the protective glass. Thus, the images of the dusts are out of focus on the surface of the photoresist on the silicon wafer, not affecting the patterning. In this method, however, since images of defects must be made fuzzy on the desired focal plane by the locational difference between the pattern surface and the exterior surface of the protective glass, the latter has need of a considerable thickness. The required thickness of the glass is in linear proportion to the size of the defect. For example, when the latter is 10 $\mu$m, it is enough that the thickness of the protective glass is about 1 mm. But the defect of 50 $\mu$m requires the protective glass of about 5 mm thickness. If the thickness of the glass increases, as a matter of course, the absorption of light therein also increases. This results long exposure time for the patterning or large luminance brightness of the light source. The increase of the luminance brightness of the light source, however, causes, in addition to technical problems and enormousness of the system, considerable heat which results shortening of the machine life. The elevation of the temperature also results the displacement of the pattern or physical damage thereto due to the thermal expansion of the photomask. This problem will be avoided if a glass composition with low absorption of light is used. In that case, however, because such a composition is peculiar and so the glass having that composition is not mass-produced industrially, the latter becomes expensive. Besides, in such glasses, there is fluctuation of quality such as accuracy of dimension and homogeneity. If the thickness of the protective glass increases, another problem arises in addition to the above-described absorption problem. That is, because the difference of the refractive index due to the inhomogeneity in the glass is accumulated, distortion of the pattern image on the photoresist becomes considerable.

Recently, as integration of LSI is advanced, it has been required that the width of pattern line on silicon wafer is more decreased. For this purpose, the wavelength of light for exposure must be shortened and so light having the wavelength in ultraviolet range is used. In that case, however, absorption of light in glass is remarkably increased. Accordingly, it has been desired that the absorption of light in the protective glass is decreased even if special glass such as ultraviolet ray transmitting glass is used.

Pattern image projected on the photoresist contains an image with rays which passed through the apertures of the photomask without reflection and another image with rays which passed out of the apertures after being reflected by the boundaries between the interior and exterior of the aperture. After being introduced in the aperture, the latter rays are reflected first by the near side boundary to the photoresist and then by the remote side boundary and subsequently passed out of the aperture. On the optical axis, the above both images perfectly coincide with each other, resulting no problem. Out of the optical axis, however, there appears locational difference between them on the photoresist surface so the pattern image is confused. If the thickness of the aperture, that is, thickness of the photomask is in order of $\mu$m, that confusion is tolerable because the locational differnce between the both images is little. On the other hand, if the photomask is considerably thick, e.g., more than 5 mm, the image with the reflected rays is out of focus on the photoresist surface because of optical-path difference, resulting no problem. If the thickness of the photomask is within the range between scores $\mu$m and several mm, however, the image with the reflected rays is made in the vicinity of the photoresist surface so the confusion of the pattern image becomes remarkable.

In the U.S. Pat. No. 4,131,363, there is described a pellicle cover for projection system, in which a pellicle made of organic resin and having the thickness of several $\mu$m is stretched over a ring-like spacer. Because the pellicle is very thin, absorption of light terein is little and confusion of the pattern image due to the image with the reflected rays is ignorable. Such pellicle, however, is very delicate and breakable because it is made of thin organic material. Moreover, static electricity tends to generate on the pellicle so dusts or other contamination particles are apt to adhere thereto. Although the pellicle cover is to make the location of adherence of the dusts differ from that of the pattern surface, a large number of dusts adhering to the pellicle cover affect the pattern image as a matter of course. Accordingly, cleaning of the cover is necessary and so the pellicle may be scratched or broken in the cleaning process. In the case that ultraviolet rays are used for exposure, the material of the pellicle is deteriorated by irradiation with the light of the short wavelength so that the transparency of the cover becomes bad and the pellicle becomes brittle to shorten the life thereof. Besides, the pellicle expands considerably because of the large expansion coefficient, which causes looseness of the pellicle or rumples thereon.

SUMMARY OF THE INVENTION

Accordingly, it is an object of this invention to provide a protective cover for photoprinting system which has the high mechanical strength and so long life.

It is another object of this invention to provide a protective cover for photoprinting system in which absorption of light is little and confustion of pattern image due to the image with reflected rays is ignorable.

It is still another object of this invention to provide a protective cover for photoprinting system with high cost-performance.

The above and further objects are attained by the invention as follows. A protective cover for photoprinting system comprises a cover portion made of a transparent thin plate of inorganic material, an antireflection multiple coating provided on at least one of the inner and outer surfaces of the cover plate, and a spacer arranged on the peripheral portion of the cover plate for keeping the inner surface of the cover plate away from the pattern surface and sealing the space between them.

The above and further objects and novel features of the invention will more fully appear from the following detailed description when the same is read in connection with the accompanying drawings. It is to be expressly understood, however, that the drawings are for purpose of illustration only and are not intended as a definition of the limits of the invention.

DETAILED DESCRIPTION OF THE PREFERRED EMBODIMENTS

Figure 1:
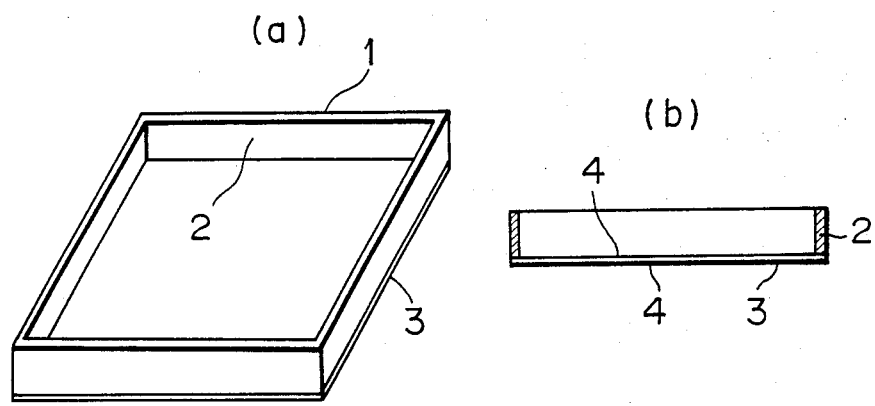
FIGS. 1(a) and (b) are a perspective view and a sectional view of a protective cover according to embodiment of the invention, respectively.

FIG. 1 shows a protective cover 1 according to an embodiment of the invention, which comprises a frame-like spacer 2 and a cover plate 3 made of transparent inorganic material. The former is made to adhere onto the peripheral portion of the latter. The thickness of the cover plate is within the range between 5 $\mu$m and 1 mm. On at least one of the inner and outer surfaces of the cover plate, an antireflection multiple coating 4 is provided.

The spacer 2 may be made of solid material such as metal, other inorganic material, plastics or wood. The material of the spacer is preferably selected in order to have the expansion coefficient similar to that of the cover plate for avoiding thermal stress.

The cover plate 3 may be made of inorganic glass such as sheet glass (soda-lime glass), ultraviolet ray transmitting glass and silica glass, or inorganic transparent crystalline material. Reasons why the cover plate must be made of inorganic material is as follows. Generally, the expansion coefficient of inorganic material is smaller than that of organic material so bend of the cover plate or rumples thereon scarcely arise in contrast to organic pellicle. The deterioration of the inorganic cover plate with ultraviolet rays is less than that of organic pellicle. Since the hardness of the inorganic cover plate is higher than that of organic pellicle, the cover plate is hard to be scratched, e.g., in cleaning process. Besides, because of the high heat resistance, the cover plate can be heated when the multiple coating is formed thereon. As a result, the multiple coating hard to peel or to be scratched can be formed.

The spacer 2 and cover plate 3 may be provided seperately and then adhered to each other with organic or inorganic adhesive. They may be welded with each other by heat. Alternatively, the spacer and cover plate may be integrally formed by pressing a sheet glass with heat.

On at least one of the inner and outer surfaces of the cover plate 3, an antireflection multiple coating 4 is provided for avoiding confusion of the pattern image due to the reflection at the inner or outer boundary of the cover plate and increasing the transmitting quantity of light through the cover plate. The materials and thickness of the coating must be selected in accordance with the wavelength of light used for exposure as described hereinafter. The coating may be formed by vacuum deposition method, CVD method, spattering method or the like.

Figure 2:
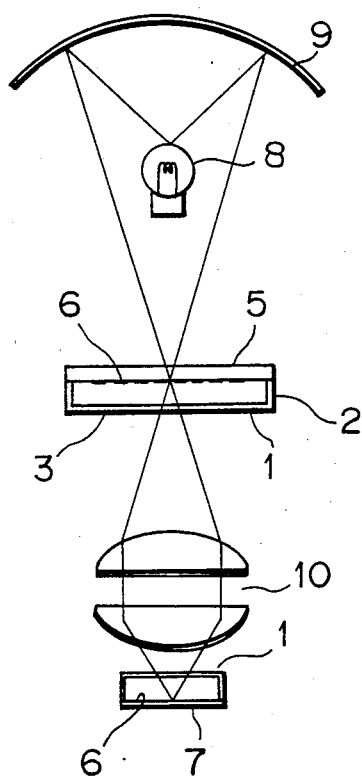
FIG. 2 is a schematic view of a photoprinting system.

FIG. 2 shows a photoprinting system according to an embodiment of the invention. Light from a light source 8 is reflected by a condenser mirror 9 and then passes through a photomask 5 or reticle. The light is then introduced to the pattern surface 6 of a wafer 7 through convergence lenses 10. A protective cover 1 as described above is used for the pattern surface 6 of the photomask 5. Another protective cover 1 may be used for the pattern surface 6 of the photoresist on the wafer 7. The back surface of the photomask 5 may be protected by still another protective cover though it is not shown in the drawing.

EXAMPLES

Figure 3:
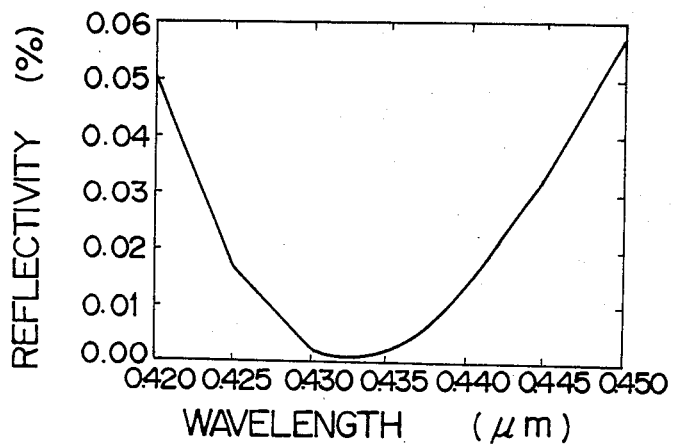
FIGS. 3 through 7 are graphs showing reflectivity characteristics of multiple coatings according to embodiments of the invention.
Figure 4:
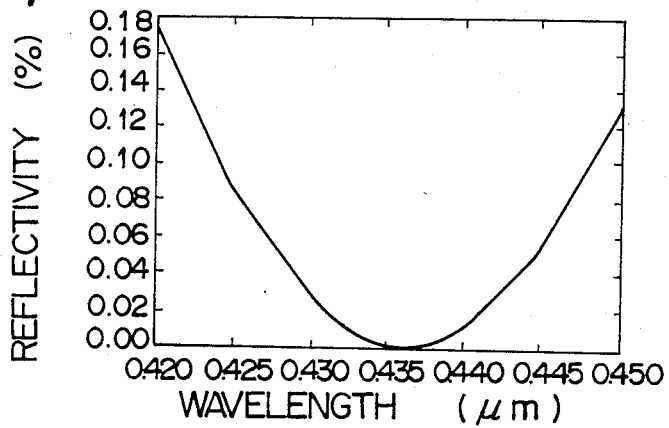
Figure 5:
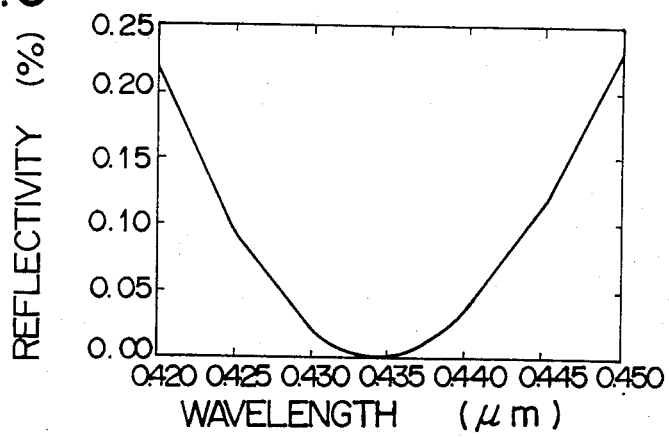

In examples 1 to 4 described in the below table, since a visible radiation of 436 nm was used for exposure, sheet glass (soda-lime glass) could be employed as cover plate. Multiple coatings indicated in the below table were formed on the both surfaces of the cover plates by vacuum deposition. Consequently, cover plates having high total transmittances could be obtained. Reflectivity characteristics of examples 1 to 3 are shown in FIGS. 3 to 5, respectively.

In examples 5 and 6 described in the table, ultraviolet rays below 400 nm were used. Since the transmittance of sheet glass as to ultraviolet rays is small, silica glasses were employed in these examples. Total transmittances of 99.5% could be obtained in the both examples in which silica glasses of 1 mm thick were used. The reflective characteristics of these examples are shown in FIGS. 6 and 7, respectively.

| Example | Configuration of antireflection multiple coating | | | | | |
|---|---|---|---|---|---|---|
| | 1 | 2 | 3 | 4 | 5 | 6 |
| Wavelength of exposure light ($\lambda$) | 436 nm | 436 nm | 436 nm | 436 nm | 365 nm | 254 nm |
| Incident medium | air | air | air | air | air | air |
| Antireflection multiple coating | | | | | | |
| first layer | | | | | | |
| material | $MgF_2$ | $MgF_2$ | $SiO_2$ | $SiO_2$ | $SiO_2$ | $SiO_2$ |
| refractive index | 1.39 | 1.39 | 1.46 | 1.46 | 1.48 | 1.51 |
| optical thickness of the layer ($x\frac{\lambda}{4}$) | 1.13 | 0.72 | 0.82 | 0.82 | 0.963 | 0.968 |
| second layer | | | | | | |
| material | $ZrO_2$ | $CeO_2$ | $TiO_2$ | $TiO_2$ | $HfO_2$ | $HfO_2$ |
| refractive index | 2.05 | 2.2 | 2.4 | 2.4 | 2.1 | 2.2 |

-continued

Figure 6:
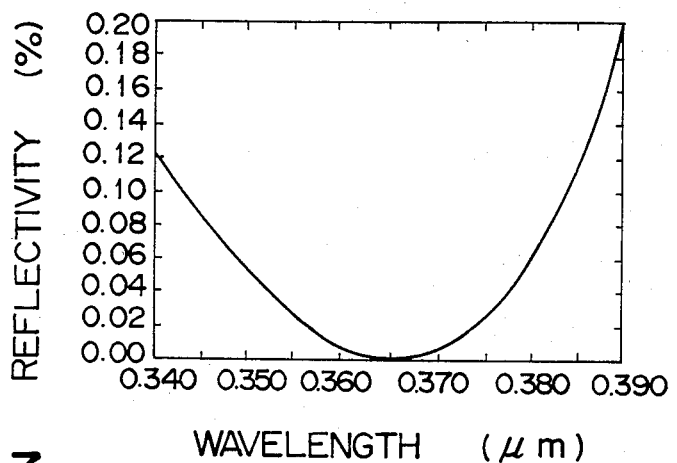
Figure 7:
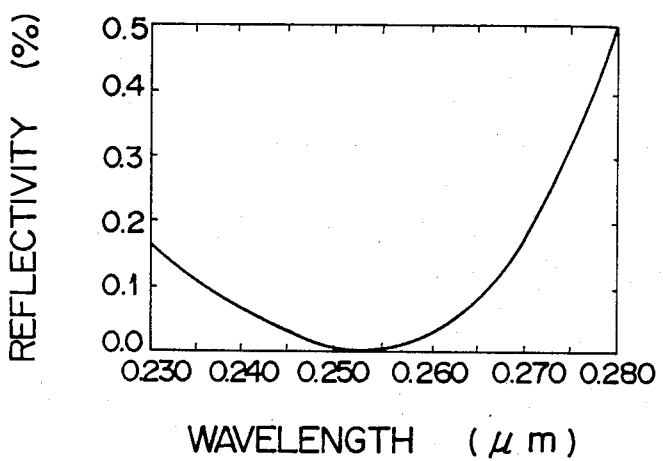

| Example | Configuration of antireflection multiple coating | | | | | |
|---|---|---|---|---|---|---|
| | 1 | 2 | 3 | 4 | 5 | 6 |
| optical thickness of the layer (x$\frac{\lambda}{4}$) third layer | 2.31 | 1.76 | 2.18 | 2.18 | 0.977 | 0.998 |
| material | Al$_2$O$_3$ | | SiO$_2$ | SiO$_2$ | SiO$_2$ | SiO$_2$ |
| refractive index | 1.63 | — | 1.46 | 1.46 | 1.48 | 1.51 |
| optical thickness of the layer (x$\frac{\lambda}{4}$) fourth layer | 1.08 | | 0.44 | 0.44 | 0.295 | 0.303 |
| material | — | — | TiO$_2$ | TiO$_2$ | HfO$_2$ | HfO$_2$ |
| refractive index | | | 2.4 | 2.4 | 2.1 | 2.2 |
| optical thickness of the layer (x$\frac{\lambda}{4}$) | | | 0.36 | 0.36 | 0.296 | 0.299 |
| Material of cover plate | sheet glass | sheet glass | sheet glass | sheet glass | silica glass | silica glass |
| Thickness of cover plate | 1 mm | 0.5 mm | 0.03 mm | 0.005 mm | 1 mm | 1 mm |
| Reflectivity characteristic | FIG. 3 | FIG. 4 | FIG. 5 | — | FIG. 6 | FIG. 7 |
| Total transmittance | 98.9% | 99.3% | 99.7% | 99.8% | 99.5% | 99.5% |

In a protective cover according to the invention, since the mechanical strength of the cover plate is large, the cover plate can be made thin so that absorption of light therein is decreased. Since an antireflection multiple coating is provided on the cover plate, confusion of the pattern image due to rays reflected by the inside and outside boundaries of the cover plates can be avoided. Besides, since the cover plate of transparent inorganic material shows high heat resistance, a multiple coating of voluntary materials can be formed on the cover plate with accurate control of the thickness of each layer. A protective cover of the invention may be used for at least one of the pattern surface and the back surface of photomask and the pattern surface of wafer.

What is claimed is:

1. A protective cover for photoprinting system comprising a cover portion made of a transparent thin plate of inorganic material, an antireflection multiple coating provided on at least one of the inner and outer surfaces of said cover plate, and a spacer arranged on the peripheral portion of said cover plate for keeping said inner surface of said cover plate away from the surface to be protected and sealing the space between them.

2. A protective cover for photoprinting system according to claim 1, wherein said inorganic cover plate has the thickness within the range between 5 μm and 1 mm.

3. A protective cover for photoprinting system according to claim 1, wherein said inorganic cover plate is made of glass.

4. A protective cover for photoprinting system according to claim 3, wherein said cover plate and said spacer are integrally formed by pressing a sheet glass.

5. A protective cover for photoprinting system according to claim 1, wherein said cover plate and said spacer are seperately prepared and made to adhere to each other.

6. A protective cover for photoprinting system according to claim 5, wherein said spacer is made of one selected from a group of metal, other inorganic material, plastics and wood.

7. A protective cover for photoprinting system according to claim 6, wherein the material of said spacer is selected in order to have the expansion coefficient similar to that of said cover plate.

* * * * *